United States Patent
Jensen (10) Patent No.: US 8,964,456 B2
(45) Date of Patent: Feb. 24, 2015

(54) SEMICONDUCTOR MEMORY WITH SIMILAR RAM AND ROM CELLS

(75) Inventor: Dan C. R. Jensen, Hellerup (DK)

(73) Assignee: GN Resound A/S, Ballerup (DK)

( * ) Notice: Subject to any disclaimer, the term of this patent is extended or adjusted under 35 U.S.C. 154(b) by 198 days.

(21) Appl. No.: 13/457,129

(22) Filed: Apr. 26, 2012

(65) Prior Publication Data

US 2013/0286719 A1    Oct. 31, 2013

(30) Foreign Application Priority Data

Apr. 26, 2012 (DK) .................................. 2012 70211
Apr. 26, 2012 (EP) ..................................... 12165659

(51) Int. Cl.

| | |
|---|---|
| G11C 11/00 | (2006.01) |
| G11C 11/40 | (2006.01) |
| G11C 17/10 | (2006.01) |
| G11C 17/12 | (2006.01) |
| G11C 8/16 | (2006.01) |
| G11C 11/411 | (2006.01) |
| G11C 11/412 | (2006.01) |

(52) U.S. Cl.
CPC ............. *G11C 11/40* (2013.01); *G11C 11/005* (2013.01); *G11C 17/10* (2013.01); *G11C 17/12* (2013.01); *G11C 8/16* (2013.01); *G11C 11/4116* (2013.01); *G11C 11/412* (2013.01)
USPC ............................ 365/156; 365/154; 365/104

(58) Field of Classification Search
USPC ......................................... 365/156, 154, 104
See application file for complete search history.

(56) References Cited

U.S. PATENT DOCUMENTS

| | | | |
|---|---|---|---|
| 4,059,826 A | 11/1977 | Rogers | |
| 4,510,584 A | 4/1985 | Dias et al. | |
| 4,538,246 A | 8/1985 | Wang et al. | |
| 4,575,819 A | 3/1986 | Amin | |
| 4,638,465 A | 1/1987 | Rosini et al. | |
| 5,353,248 A | 10/1994 | Gupta | |
| 5,923,582 A | 7/1999 | Voss | |
| 6,128,218 A * | 10/2000 | You et al. ...................... | 365/156 |
| 6,765,818 B2 | 7/2004 | Kanzaki et al. | |
| 7,920,411 B2 | 4/2011 | Chang et al. | |
| 2004/0052103 A1 | 3/2004 | Schmidt et al. | |
| 2008/0087938 A1 | 4/2008 | Jeon et al. | |
| 2008/0170430 A1 | 7/2008 | Miller et al. | |

(Continued)

FOREIGN PATENT DOCUMENTS

| | | |
|---|---|---|
| JP | 54-146935 | 11/1979 |
| JP | 62-170090 | 7/1987 |

(Continued)

OTHER PUBLICATIONS

First Technical Examination dated Nov. 7, 2012, for Danish Patent Application No. PA 2012 70211.

(Continued)

*Primary Examiner* — Toan Le
(74) *Attorney, Agent, or Firm* — Vista IP Law Group, LLP (57) ABSTRACT

A semiconductor memory includes an array of volatile memory cells, wherein one of the volatile memory cells has transistors connected in a first memory cell circuit, and at least one non-volatile memory cell having transistors connected in a second memory cell circuit, wherein the transistors in the first memory cell circuit are at least one more than the transistors in the second memory cell circuit.

14 Claims, 12 Drawing Sheets

(56) References Cited

U.S. PATENT DOCUMENTS

2008/0297195 A1  12/2008  Urakawa
2009/0071486 A1  3/2009   Perez et al.
2010/0214824 A1  8/2010   Chang et al.

FOREIGN PATENT DOCUMENTS

| | | |
|---|---|---|
| JP | 02-049299 | 2/1990 |
| JP | 04-042495 | 2/1992 |
| JP | 04-238194 | 8/1992 |
| JP | 08-273365 | 10/1996 |
| JP | 2007-226927 | 9/2007 |
| WO | WO 2011/001560 A1 | 1/2011 |

OTHER PUBLICATIONS

Notice of Reason for Refusal dated Dec. 24, 2013 for related Japanese Patent Application No. 2013-091292, 4 pages.

Second Technical Examination dated Oct. 16, 2013 for DK Patent Application No. PA 2012 70211.

Third Technical Examination dated Feb. 18, 2014 for DK Patent Application No. PA 2012 70211.

Extended European Search Report dated Sep. 13, 2012 for EP Patent Application No. 12165659.9.

First Office Action dated May 5, 2014 for related Chinese Patent Application No. CN 201310150378.5, 10 pages.

Japanese Office Action dated Dec. 9, 2014 for related JP Patent Application No. 2013-091292, 13 pages.

* cited by examiner (Prior art)

(Prior art)

SEMICONDUCTOR MEMORY WITH SIMILAR RAM AND ROM CELLS

RELATED APPLICATION DATA

This application claims priority to and the benefit of Danish Patent Application No. PA 2012 70211, filed on Apr. 26, 2012, pending, and European Patent Application No. 12165659.9, filed on Apr. 26, 2012, pending, the disclosures of both of which are expressly incorporated by reference herein.

FIELD

The present application relates to memory circuits. More particularly, the present application relates to a semiconductor memory with an array of volatile and non-volatile cells.

BACKGROUND

Many computer systems include volatile and non-volatile memory devices. Volatile memory is generally used to store data that a system may need to exchange quickly, such as data used by a computer program. Volatile memory loses its data when power is removed. Examples of volatile memory include static random access memory (SRAM) and dynamic random access memory (DRAM).

Non-volatile memory is generally used to store data that needs to be saved for long periods of time or needs some degree of security. Examples of such data are BIOS, program code, and system software. Non-volatile memory devices include read only memory (ROM), EPROM, EEPROM, flash, magnetic storage media, compact disks, laser disks, and optical disks.

Some memory cells have been developed that include both a volatile memory circuit and a non-volatile memory circuit. For example, U.S. Pat. No. 4,510,584, U.S. Pat. No. 4,538,246, U.S. Pat. No. 4,638,465, and U.S. Pat. No. 5,353,248, disclose memory cells having a non-volatile circuit that stores the state of a volatile circuit such that data stored in the volatile memory circuit is not lost when power is removed from the memory cell. The size of these memory cells is larger than the size of conventional volatile memory cells to accommodate the additional non-volatile circuitry. Thus, the number of memory cells including both volatile and non-volatile circuits is less than the number of conventional volatile memory cells per area of silicon.

Additionally, complex circuitry or additional power supply voltages may be required to control the operation of conventional memory cells having volatile and non-volatile memory circuits. The circuits may require additional commands to invoke their operation or additional power supply voltages to program the non-volatile memory circuit of the memory cell.

U.S. Pat. No. 5,923,582 discloses a memory device with a combination of a first block of RAM cells having preprogrammed states, and a second block of conventional random access memory cells. A select circuit is configured to reset the first block of RAM cells to their preprogrammed states. The desired ROM code is stored in the first block of RAM cells by unbalancing transistors in the cells so that the cells power up in the desired predetermined state consistent with the ROM code to be stored in the first block of RAM cells. The select circuit alters the power applied to the first block of RAM cells to cause the RAM cells to power up with the ROM code. Thus, the first block of RAM cells are configured to operate as both a volatile and nonvolatile memory cell using the same cell structure.

U.S. Pat. No. 6,765,818 discloses a static CMOS RAM with memory cells with cross-coupled inverters and wherein some of the cells operate as ROM cells by connection of an input of one of the inverters of each cell to one of a fixed low electric potential and a fixed high electric potential and connection of the output of the inverter to the input of the other inverter of the respective cell.

SUMMARY

There is a need for a memory device comprising a combination of volatile cells and non-volatile cells that can be provided with a simplified production process.

A semiconductor memory is provided with an array of volatile and non-volatile cells.

The new semiconductor memory may be manufactured with a production process that is almost identical to the production process of a conventional RAM device.

The new semiconductor memory may be manufactured with a production process that is identical to the production process of a conventional RAM device with the exception of a change of one of the masks applied during wafer processing.

It is presently preferred to change one diffusion mask in order to turn volatile cells into non-volatile cells containing a logic "1" or logic "0" as desired.

The single mask programmability of the new semiconductor memory makes the device flexible so that changes in content of the non-volatile part of the memory and changes in the size of the non-volatile part of the memory can be made in a time and cost effective way.

Thus, a semiconductor memory is provided with an array of volatile memory cells, wherein individual volatile memory cells have transistors connected in a first memory cell circuit, and with at least one non-volatile memory cell having transistors connected in a second memory cell circuit, wherein the first memory cell circuit is formed or designed by addition of at least one transistor to the second memory cell circuit, i.e. the first memory cell circuit has at least one transistor added to the second memory cell circuit Examples of volatile memory include static random access memory (SRAM) and dynamic random access memory (DRAM), etc.

Examples of non-volatile memory include read only memory (ROM), programmable read only memory (PROM), erasable programmable read only memory (EPROM), electrically erasable programmable read only memory (EEPROM), etc.

The memory may be a multi-port memory, i.e. a memory in which multiple cells may be accessed during the same read-write cycle, for example a dual-port memory in which two memory cells may be accessed simultaneously during the same read-write cycle. The first memory cell circuit may be a static RAM memory cell circuit.

The first memory cell circuit may include transistors connected as two cross-coupled inverters, e.g. formed by two transistors as for example in a conventional ECL RAM cell, or formed by four transistors as in a conventional static CMOS RAM.

Preferably, the semiconductor memory is manufactured in CMOS; however, the semiconductor memory may be manufactured with any suitable process for integrated circuits, such as a bipolar process, etc.

Preferably, the ROM memory cells are mask-programmable ROM memory cells, the second memory cell circuit may for example be obtained by provision of a corresponding diffusion mask.

The new semiconductor memory may be used with the digital signal processor of a hearing aid, for example as an on-chip RAM circuit of the digital signal processor, or on a chip external to the digital signal processor. The non-volatile part of the new semiconductor memory may contain a bootstrap loader for the digital signal processor loading programmes for execution by the digital signal processor from an external non-volatile memory device into the RAM of the digital signal processor.

The non-volatile part of the new semiconductor memory may also contain signal processing programmes for execution by the digital signal processor.

In accordance with some embodiments, a semiconductor memory includes an array of volatile memory cells, wherein one of the volatile memory cells has transistors connected in a first memory cell circuit, and at least one non-volatile memory cell having transistors connected in a second memory cell circuit, wherein the transistors in the first memory cell circuit are at least one more than the transistors in the second memory cell circuit.

In one or more embodiments, the first memory cell circuit and the second memory cell circuit may have substantially the same configuration. As used in this specification, two memory cell circuits are considered as having substantially the same configuration when a majority (e.g., more than 50%, and more preferably more than 80%) of the components in one of the two memory cells circuits are the same as the majority of the components in the other one of the two memory cells circuits.

Other and further aspects and features will be evident from reading the following detailed description of the embodiments.

BRIEF DESCRIPTION OF THE DRAWINGS

Below, the embodiments will be described in more detail with reference to the drawings, wherein.

DETAILED DESCRIPTION OF EXAMPLES

Various embodiments are described hereinafter with reference to the figures. It should be noted that elements of similar structures or functions are represented by like reference numerals throughout the figures. It should also be noted that the figures are only intended to facilitate the description of the embodiments. They are not intended as an exhaustive description of the invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments, even if not so illustrated, or even if not so explicitly described.

The new semiconductor memory will now be described more fully hereinafter with reference to the accompanying drawings, in which various examples are shown. The accompanying drawings are schematic and simplified for clarity.

The invention as defined in the appended claims may be embodied in different forms not shown in the accompanying drawings and should not be construed as limited to the examples set forth herein.

Figure 1:
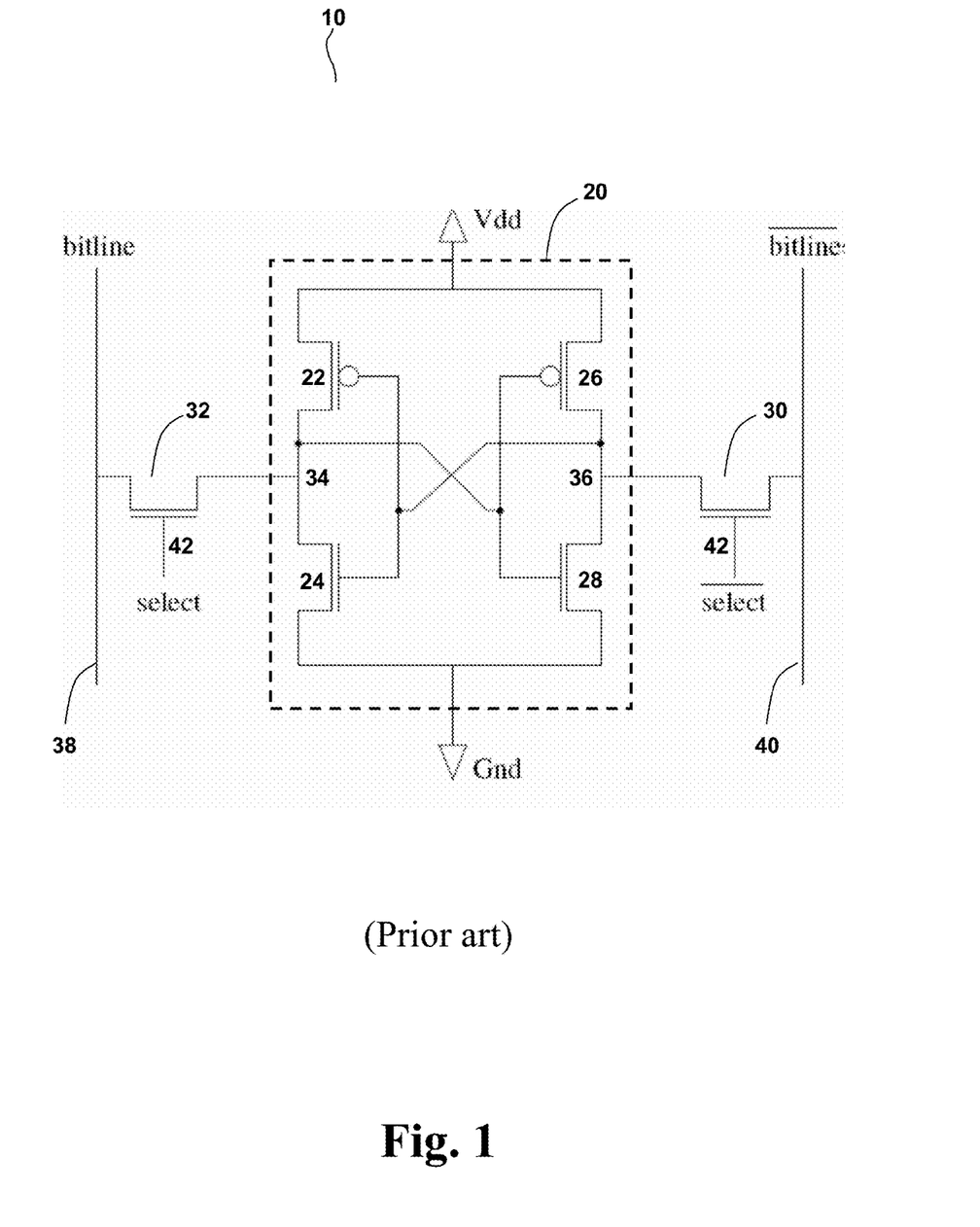
FIG. 1 shows a circuit diagram of a conventional CMOS SRAM cell.

FIG. 1 shows one conventional static CMOS RAM memory cell 10 of the array of RAM memory cells of one example of the new semiconductor memory. The illustrated memory cell 10 comprises two cross-coupled inverters connected in a first memory cell circuit 20.

The SRAM cell 10 is a six transistor cell that operates as a conventional static RAM cell.

SRAM cell 10 includes two cross-coupled CMOS inverter circuits. The first inverter circuit includes PMOS transistor 22 coupled in series with NMOS transistor 24. PMOS transistor 22 has a source coupled to power supply $V_{DD}$, a drain coupled to the drain of NMOS transistor 24 at node 34, and a gate coupled to the gate of NMOS transistor 24 and node 36. NMOS transistor 24 has a source coupled to ground. The second inverter circuit includes PMOS transistor 26 coupled in series with NMOS transistor 28. PMOS transistor 26 has a source coupled to the source of PMOS transistor 22 and power supply $V_{DD}$, a drain coupled to the drain of NMOS transistor 28 at node 36, and a gate coupled to the gate of NMOS transistor 28 and node 34. The source of NMOS transistor 28 is coupled to ground.

SRAM cell 10 also includes pass transistors 30 and 32. Pass transistor 32 has a source (drain) terminal coupled to node 34 and a drain (source) terminal coupled to bitline 38. Pass transistor 30 has a source (drain) coupled to node 36 and a drain (source) terminal coupled to $\overline{\text{bitline}}$ 40. Bitline 38 and $\overline{\text{bitline}}$ 40 may be coupled to a column decoder. The gates of pass transistors 32 and 30 are coupled to word line 42. Word line 42 may be coupled to row decoder. When word line 42 is asserted to a high logic state, pass transistors 32 and 30 are enabled to pass the voltages on bitline 38 and $\overline{\text{bitline}}$ 40 to nodes 34 and 36, respectively.

When word line 42 is driven to a high logic state, data may be written to nodes 34 and 36 by driving voltages on bitline 38 and $\overline{\text{bitline}}$ 40, and data may be read from nodes 34 and 36 by sensing the voltages passed to bitline 38 and $\overline{\text{bitline}}$ 40.

Figure 2:
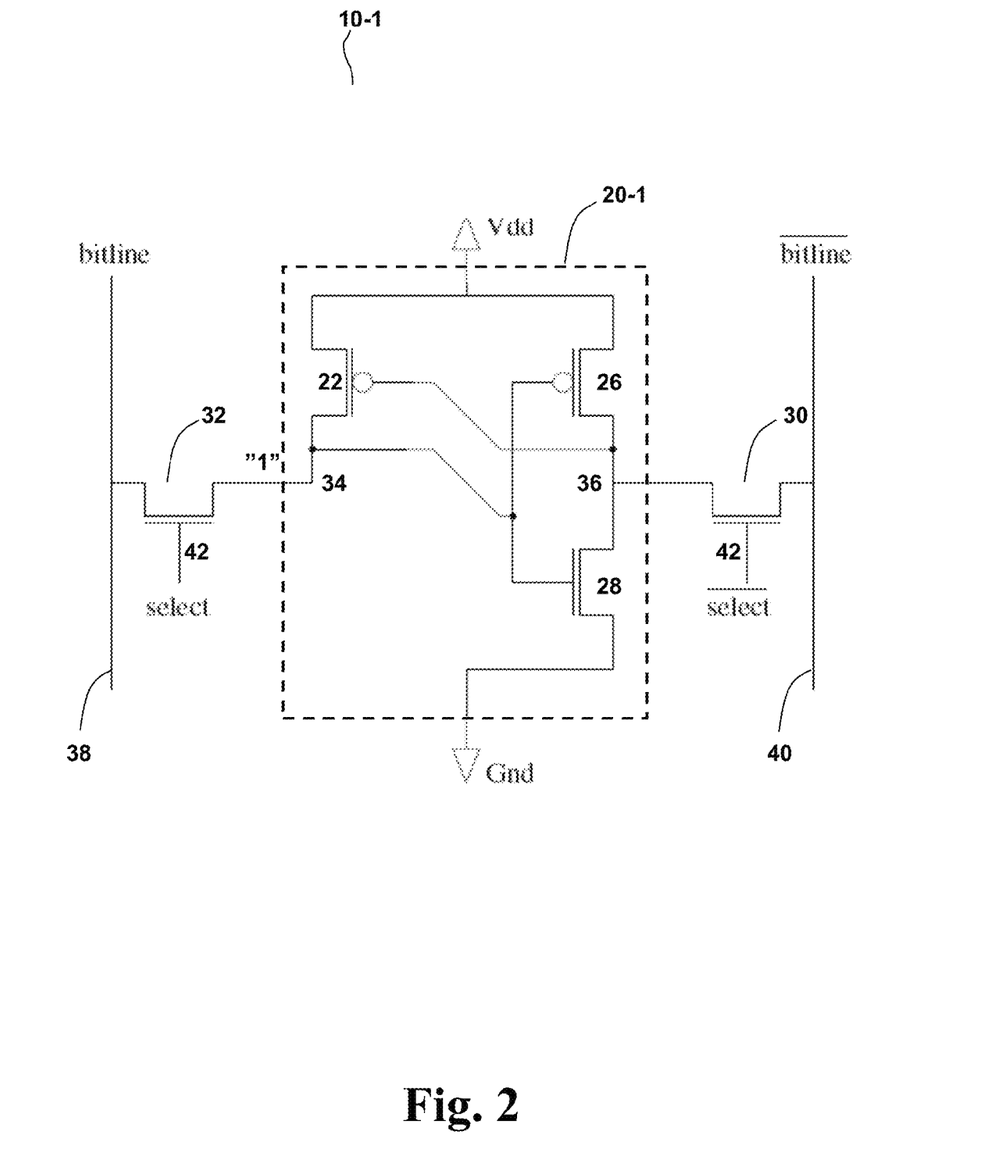
FIG. 2 shows a circuit diagram of a new ROM cell of the new semiconductor memory, FIG. 3. shows a circuit diagram of another new ROM cell of the new semiconductor memory.

FIG. 2 shows one CMOS ROM memory cell 10-1 of the new semiconductor memory. The ROM memory cell 10-1 has transistors connected in a second memory cell circuit 20-1, wherein the first memory cell circuit 20 has transistor 24 added to the second memory cell circuit 20-1; or the other way around, in the second memory cell circuit 20-1, transistor 24 has been omitted from the first memory cell circuit 20.

When the illustrated CMOS ROM memory cell 10-1 is powered-on, leakage currents will turn transistor 28 on and transistor 22 off and the cell 10-1 remains in this state until power-off. Thus, CMOS ROM memory cell 10-1 contains a logic "1".

In another CMOS ROM memory cell containing a logic "1", PMOS transistor 26 has been omitted from the first memory cell circuit 20 instead of NMOS transistor 24.

Figure 3:
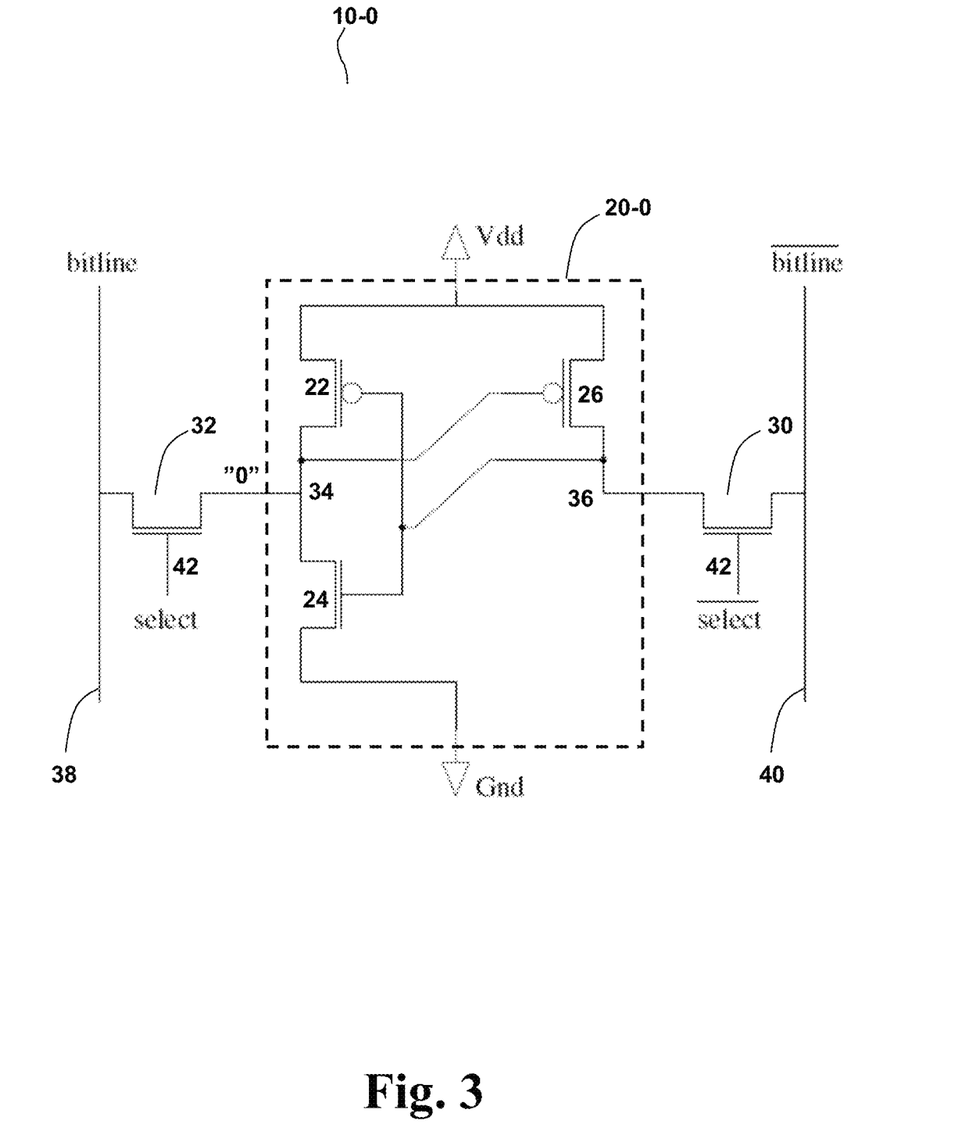

FIG. 3 shows another CMOS ROM memory cell 10-0 of the new semiconductor memory. The ROM memory cell 10-0 has transistors connected in a second memory cell circuit 20-0, wherein the first memory cell circuit 20 is has NMOS transistor 28 added to the second memory cell circuit 20-0; or the other way around, in the second memory cell circuit 20-0, transistor 28 has been omitted from the first memory cell circuit 20.

When the illustrated CMOS ROM memory cell 10-0 is powered-on, leakage currents will turn transistor 24 on and transistors 22, 26 off and the cell 10-0 remains in this state until power-off. Thus, CMOS ROM memory cell 10-0 contains a logic "0".

In another CMOS ROM memory cell containing a logic "0", PMOS transistor 22 has been omitted from the first memory cell circuit 20 instead of NMOS transistor 28.

Figure 4:
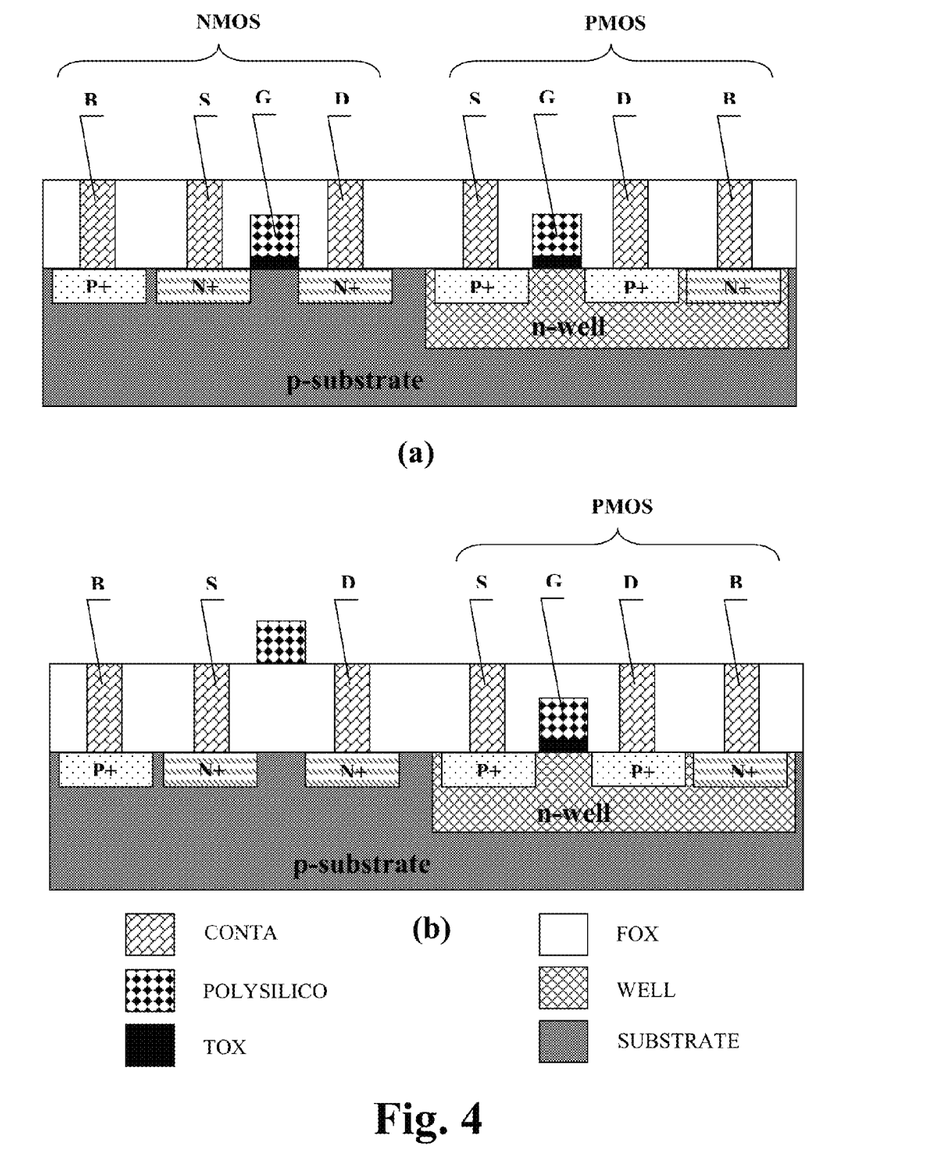
FIG. 4 is a cross-section of a CMOS inverter in a memory cell.

FIG. 4(*a*) shows a cross-section of a wafer of semiconductor material with a CMOS inverter of a RAM cell 20 of the new semiconductor memory. One way of omitting one of the transistors of the illustrated inverter is to omit one of the sources and drains of the transistors, preferably by omitting diffusion of a p+ region of the PMOS transistor otherwise formed; or by omitting diffusion of a n+ region of the NMOS transistor otherwise formed. This may be obtained by omission of the corresponding window in the respective diffusion mask applied to the wafer during the manufacturing process. FIG. 4(*b*) shows a cross-section of a new RAM cell 20-0 or 20-1 in which the NMOS transistor has been removed.

As shown in FIG. 4(*b*), the actual cross-section of the transistor will change when removing the diffusion mask. With the diffusion mask, a thin gate oxide layer is formed where the poly-silicon mask and the diffusion mask cross as shown in FIG. 4(*a*). When this diffusion mask is omitted, a thick oxide will be formed beneath the poly-silicon gate instead as shown in FIG. 4(*b*).

Figure 5:
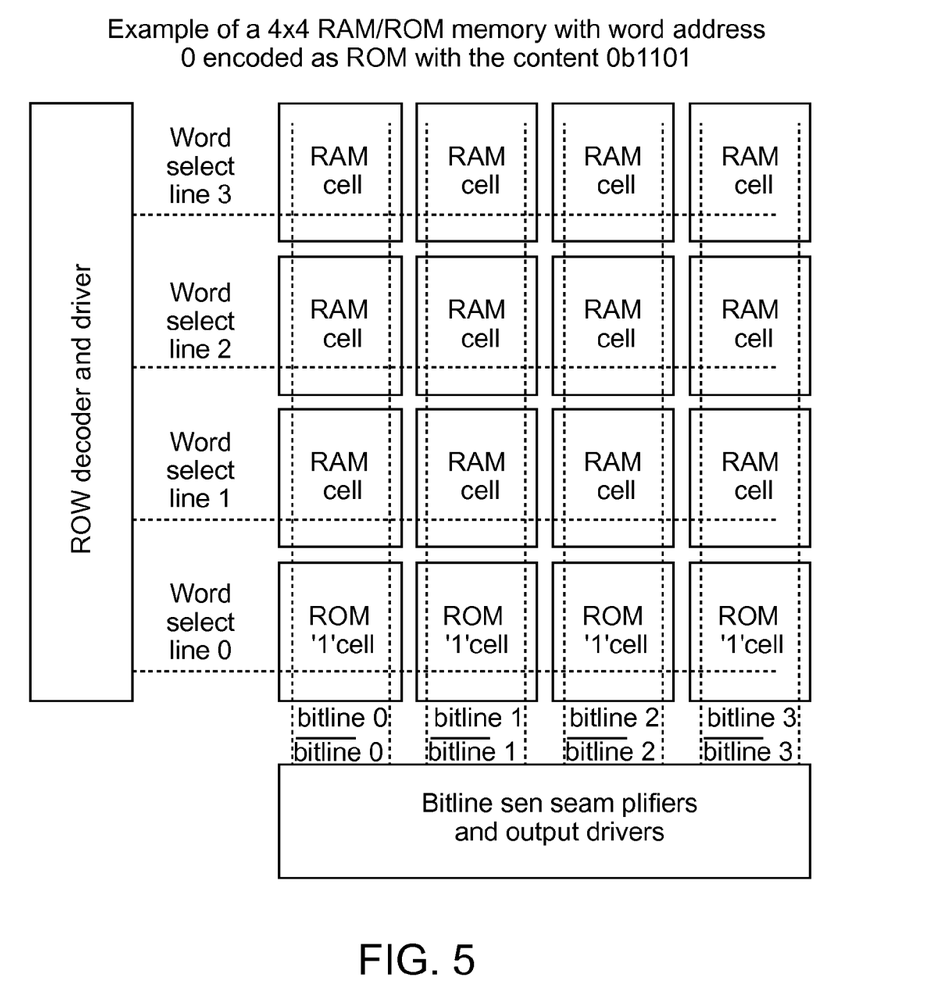
FIG. 5 shows a block diagram of a 4×4 RAM/ROM memory array with a new ROM cell.

FIG. 5 shows a block diagram of an exemplary 4×4 RAM/ROM memory array with one new ROM cell as described above having word address 0 and storing the bit values: 1101.

Figure 6:
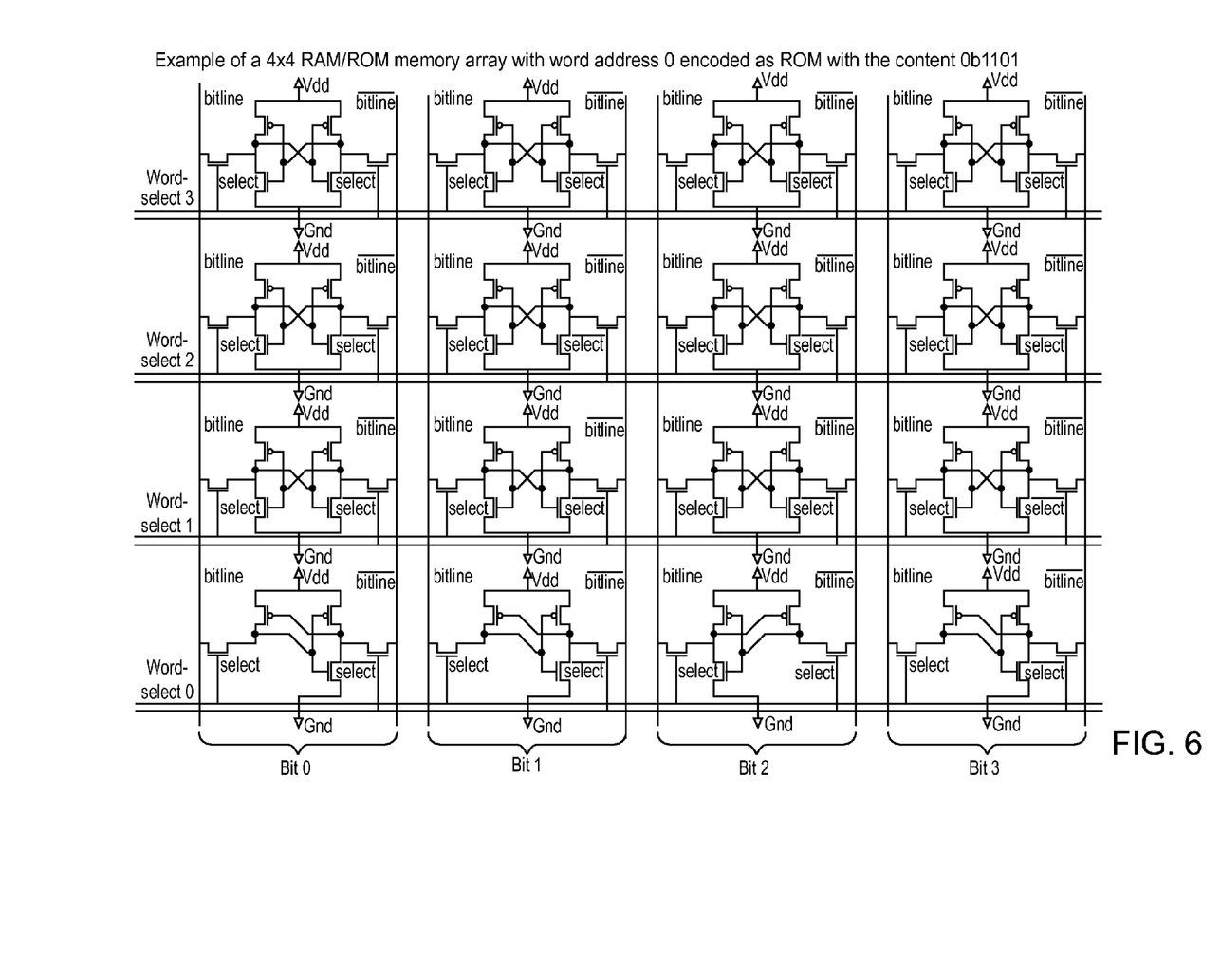
FIG. 6 shows a circuit diagram of the 4×4 RAM/ROM memory array of FIG. 5.

FIG. 6 shows a circuit diagram of the exemplary 4×4 RAM/ROM memory array of FIG. 5.

Figure 7:
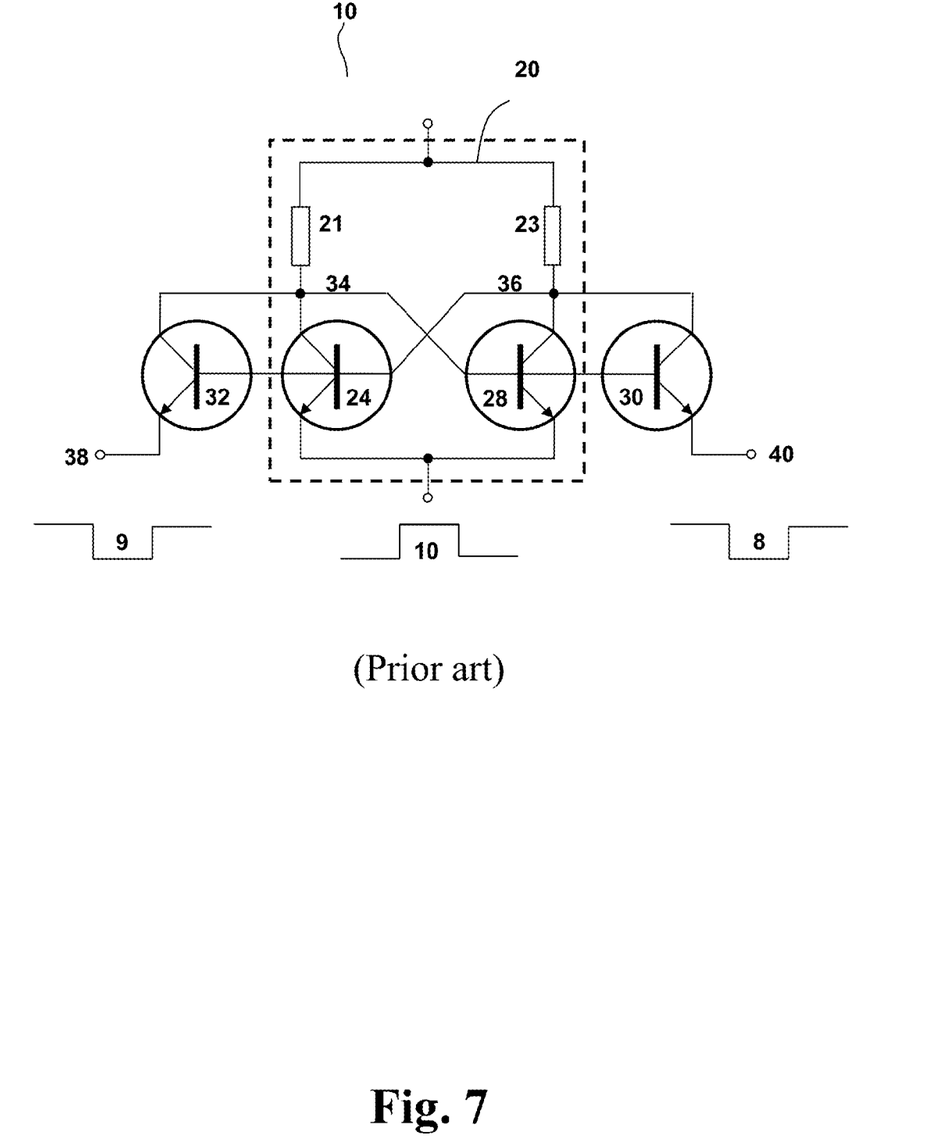
FIG. 7 shows a circuit diagram of a conventional ECL SRAM cell.

FIG. 7 shows a conventional static ECL RAM memory cell 10 of the array of RAM memory cells of another example of the new semiconductor memory. The illustrated memory cell 10 comprises two cross-coupled inverters in the form of bipolar transistors 24, 28 connected in a first memory cell circuit 20.

The SRAM cell 10 is a four transistor cell that operates as a conventional static ECL RAM cell. The illustrated bipolar transistors are NPN transistors; however with proper changes in voltage polarities, PNP transistors would work equally well. Transistors 24 and 28 are the switching transistors, and transistors 30 and 32 are the control transistors. Transistors 24 and 32 form one pair of transistors, (hereinafter called the "left pair"), including a switching transistor 24 and a control transistor 32, and transistors 28 and 30 form another pair of transistors (hereinafter called the "right pair"). The collectors and the bases of each pair of transistors are connected, and the collectors of the left pair are connected to the bases of the right pair, and vice-versa. The switching transistors are biased by application of a bias voltage between their collectors and their emitters. This bias voltage is connected to the collectors of transistors 24 and 28 through resistors 21 and 23, respectively. The emitters of the switching transistors may be connected to ground. However, this voltage need not necessarily be ground as it is selected in relation to the magnitude and polarity of the supply voltage to provide the correct biasing of the switching transistors.

The transistor biasing is such that one of the switching transistors is always ON (conducting between its collector and emitter) while the other is OFF (non-conducting between its collector and emitter). The supply voltage may for example be +3 volts. Assume that transistor 24 is conducting (ON) and that transistor 28 is then OFF. The collector voltage of the left pair (having the ON transistor) is 0 volts, and of the right pair (having the OFF transistor) is 1 volt. Since the collectors of the right pair are connected to the base of transistor 24, the bases of the left pair, these bases are also at 1 volt, as shown. The emitters of the switching transistors are at 0 volts. This places a positive base-emitter voltage of 1 volt on transistor 24. Such a positive base-emitter voltage keeps transistor 24 ON. On the other hand, the collectors of the left pair are connected to the bases of the right pair. The base of transistor 28 is thus at 0 volts. This puts the base-emitter voltage of transistor 28 at 0 volts and keeps that transistor substantially OFF.

When there are no WRITE pulses applied, the emitters of control transistors 30 and 32 are effectively open circuits. Since there is substantially no emitter current, their emitter voltages tend to follow their base voltages. The base voltage of control transistor 30 is 1 volt and the base voltage of transistor 32 is 0 volts.

When a negative WRITE pulse 8 is applied to the emitter of control transistor 30 of sufficient magnitude to reduce its emitter voltage appreciably below the base voltage, control transistor 30 turns ON and brings the collector voltage (and that of switching transistor 28) to 0 volts. The base voltage of transistor 24 is also reduced to 0 volts and that transistor is thus turned OFF because there is no longer a positive base-emitter voltage. The collector voltage of transistor 24 then rises to 1 volt, raising the base voltage of switching transistor 28 to 1 volt, and turning that transistor ON. Thus, transistor 28 which was previously OFF has been turned ON and transistor 24 which was previously ON has been turned OFF. If this WRITE pulse, however, (shown as pulse 9) were sent to control transistor 32 (which controls an ON transistor) instead of the control transistor 28 (which controls an OFF transistor), nothing would have happened. The collectors of the left pair were already at 0 volts and switching transistor 24 was ON so that the negative pulse has no effect. A WRITE pulse therefore, which is sent to the switching circuit to place the circuit in the same state (SET or RESET) that it was already in, has no effect.

The emitters of the switching transistors may be connected to a grounded control pulse source 10 instead of being connected to ground. The control pulse may be positive, for example, +1 volt. The WRITE pulses 8 and 9 are then negative pulses, for example, of sufficient value to reduce the emitter voltage on the appropriate control transistor to 0 volts.

As before, transistor 28 is OFF and has a collector voltage of 1 volt. Transistor 24 in ON and has a collector voltage of 0 volts. The emitters of the switching transistors 1 and 2 are again at 0 volts when there is no pulse from pulse source 10. With no WRITE pulses from the write pulse sources 8 and 9, the emitters of the control transistors 30 and 32 are again open circuited.

Suppose now that a WRITE pulse is sent from write pulse source 8 into the emitter of control transistor 30 sufficient only to bring that emitter to 0 volts, or ground, but no control pulse is applied to the emitters of the switching transistors. The base voltage of transistor 30 is 0 volts so there is still no positive base-emitter voltage in transistor 30 sufficient to cause base-emitter current to flow and turn the transistor ON. Therefore, in this case, no switching can take place.

When a control pulse 10 of 1 volt is applied to the emitters of transistors 1 and 2 along with the WRITE pulse to the emitter of transistor 30, the collector voltage of the left pair (having its switching transistor ON) and therefore the base voltages of the right pair are raised from 0 volts to 1 volt. Correspondingly, the collector voltage of the right pair (having its switching transistor OFF) and therefore the base voltage of the left pair is raised from 1 volt to 2 volts. When a WRITE pulse is applied to the emitter of transistor 30 which brings the emitter voltage of transistor 30 to 0 volts, the base of transistor 30 (connected to the collector of transistor 24) remains at 1 volt. There is then a +1 volt base-emitter voltage on this transistor and base-emitter current now flows in transistor 30, turning it ON. When transistor 30 is turned ON, its collector voltage becomes the same as its emitter voltage (0 volts). The collector of transistor 28 is then also at 0 volts (rather than 2 volts as before) and so is the base of transistor 24. Since the emitter of transistor 24 is at 1 volt, base-emitter current can no longer flow through it, and it is turned OFF. Its collector voltage is then raised to 2 volts, as is the base voltage of transistor 28. The emitter of transistor 28 is still at 1 volt so that base-emitter current which now flows through transistor 28 turns that transistor ON. The state of the circuit has thus been switched. When the pulses are removed, the collectors of the right pair return to 0 volts and the collectors of the left pair return to 1 volt.

This switching could not have occurred but for the application of control pulse 10 to the emitters of transistors 1 and 2 concurrent with the application of a write pulse 8 to the emitter of control transistor 30 of the pair having an OFF switching transistor. Again, no change in state would occur if a write pulse 9 were sent to the control transistor controlling an ON switching transistor even if there were a simultaneous control pulse. Furthermore, a control pulse without a write pulse would merely raise the emitter and collector voltages of the switching transistors 24 and 28, but no switching would occur.

Summarizing the operation of the circuit of FIG. 5, when the switching transistor 28 of the right pair is ON that the state of the circuit is SET, and when the switching transistor 24 of the left pair is ON that the state of the circuit is RESET. When the circuit is SET, a control pulse plus a WRITE pulse to the emitter of control transistor 32 of the left pair are required to switch it; when the circuit is RESET, a control pulse plus a WRITE pulse to the emitter of control transistor 30 of the right pair are required to switch it.

It is also possible to apply separate control pulses to the emitters of the switching transistors 30, 32. This permits separate control of each switching transistor and makes possible operation of the switching circuit in reverse. The former WRITE pulses can then be used as control pulses and vice versa.

Figure 8:
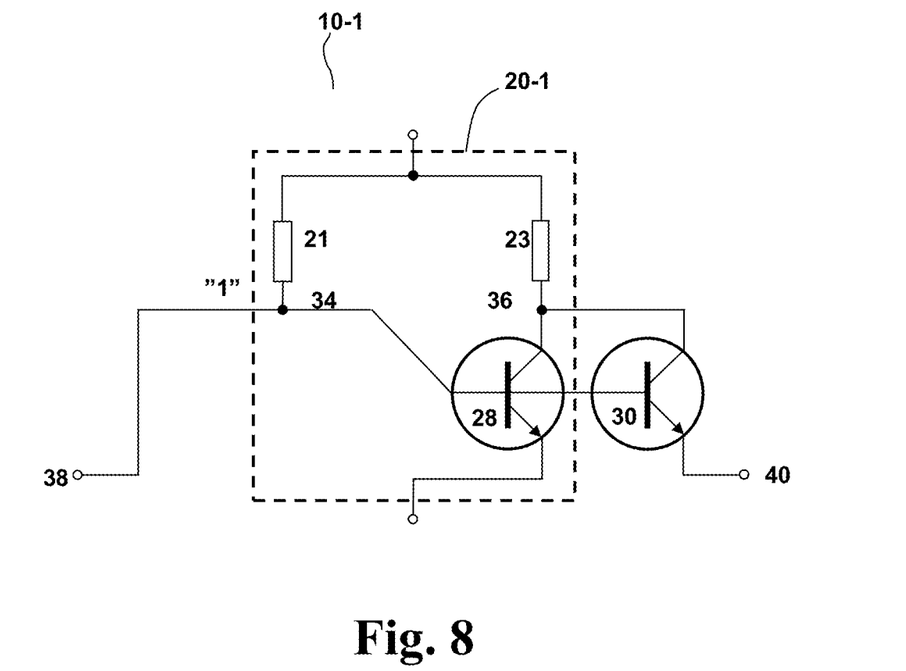
FIG. 8 shows a circuit diagram of yet another new ROM cell of the new semiconductor memory.

FIG. 8 shows one ECL ROM memory cell 10-1 of the new semiconductor memory. The ROM memory cell 10-1 has transistors connected in a second memory cell circuit 20-1, wherein the first memory cell circuit 20 has bipolar transistors 24, 32 added to the second memory cell circuit 20-1; or the other way around, in the second memory cell circuit 20-1, transistors 24, 32 have been omitted from the first memory cell circuit 20.

When the illustrated ECL ROM memory cell 10-1 is powered-on, base current through resistor 21 will turn transistor 28 on and the cell 10-1 remains in this state until power-off. Thus, the illustrated ECL ROM memory cell 10-1 contains a logic "1".

Another ECL ROM memory cell containing a logic "1" has control transistor 32 in both RAM and ROM cells 10, 10-1.

Figure 9:
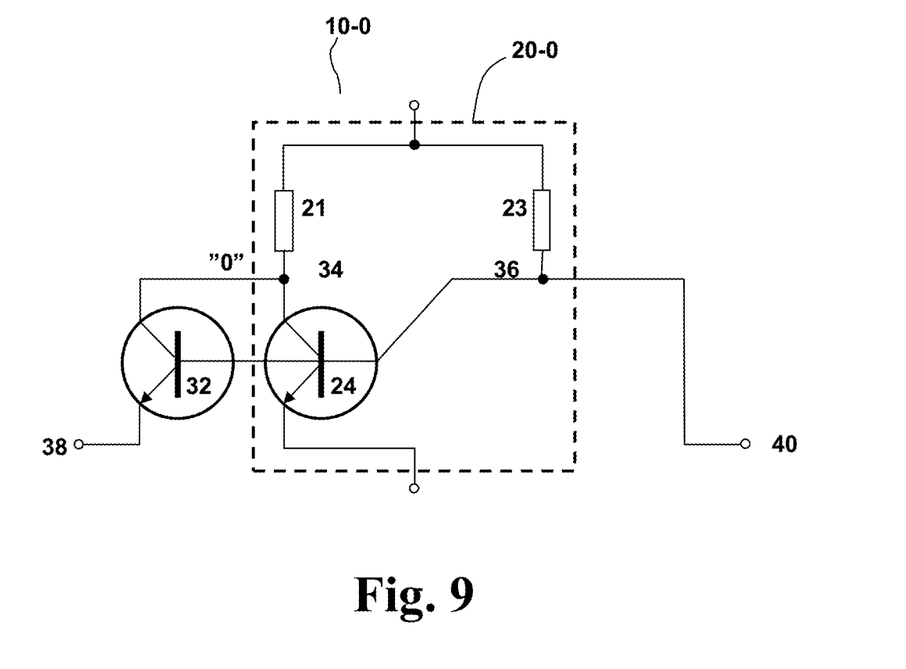
FIG. 9 shows a circuit diagram of still another new ROM cell of the new semiconductor memory.

FIG. 9 shows another ECL ROM memory cell 10-0 of the new semiconductor memory. The ROM memory cell 10-0 has transistors connected in a second memory cell circuit 20-0, wherein the first memory cell circuit 20 has bipolar transistors 28, 30 added to the second memory cell circuit 20-0; or the other way around, in the second memory cell circuit 20-0, bipolar transistors 28, 30 have been omitted from the first memory cell circuit 20.

When the illustrated ECL ROM memory cell 10-0 is powered-on, BASE current will turn transistor 24 on, and the cell 10-0 remains in this state until power-off. Thus, ECL ROM memory cell 10-0 contains a logic "0".

Another ECL ROM memory cell containing a logic "0" has control transistor 30 in both RAM and ROM cells 10, 10-0.

One way of omitting one of the transistors 24, 28 is to omit diffusion of a n or p region of the bipolar transistor otherwise formed. This may be obtained by omission of the corresponding window in the respective diffusion mask applied to the wafer during the manufacturing process.

Figure 10:
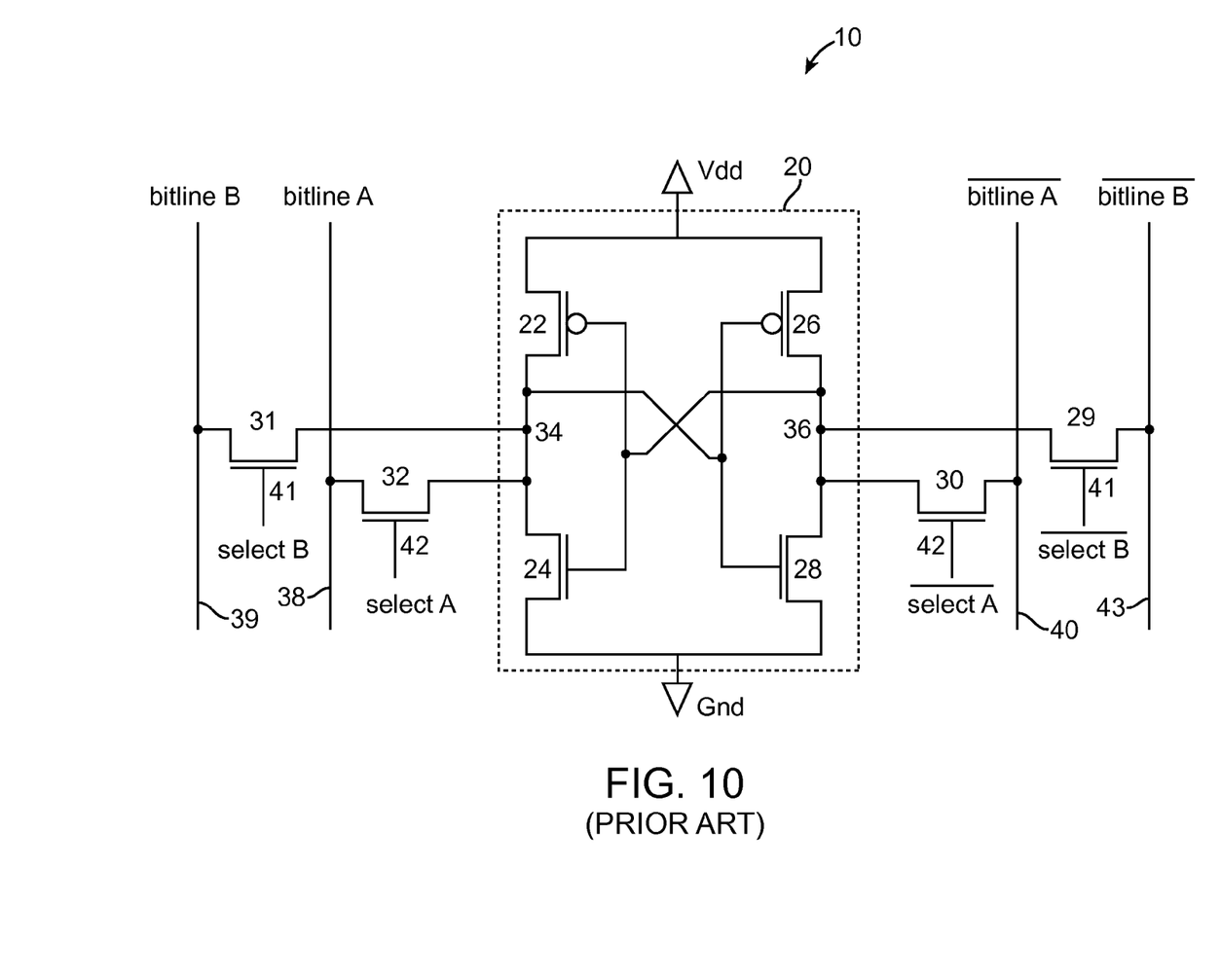
FIG. 10 shows a circuit diagram of a conventional dual port CMOS SRAM cell.

FIG. 10 shows one conventional dual port static CMOS RAM memory cell 10 of the array of RAM memory cells of another example of the new semiconductor memory. The illustrated memory cell 10 comprises two cross-coupled inverters connected in a first memory cell circuit 20 identical to the first memory cell circuit of the single port static CMOS RAM memory cell shown in FIG. 1.

The SRAM cell 10 is an eight transistor cell that operates as a conventional dual port static RAM cell. The difference between single port RAM and dual port RAM is that single port RAM can be accessed at one address at one time, i.e. only a single memory cell can be accessed during each clock cycle. In a dual port RAM, it is possible to access different memory cells at different addresses during each clock cycle due to provision of pass transistors 29 and 31 in addition to pass transistors 30 and 32. Pass transistors 31 and 32 have source (drain) terminals coupled to node 34 and drain (source) terminals coupled to bitlines 38 and 39, respectively. Pass transistors 29 and 30 have source (drain) terminals coupled to node 36 and drain (source) terminals coupled to $\overline{bitlines}$ 40 and 43, respectively. Bitlines 38, 39, 40 and 43 may be coupled to respective column decoders. The gates of pass transistors 32 and 30 are coupled to word line 42. The gates of pass transistors 29 and 31 are coupled to word line 41. Word lines 41, 42 may be coupled to respective row decoders. When word line 42 is asserted to a high logic state, pass transistors 32 and 30 are enabled to pass the voltages on bitline 38 and $\overline{bitline}$ 40 to nodes 34 and 36, respectively. Likewise, when word line 41 is asserted to a high logic state, pass transistors 29 and 31 are enabled to pass the voltages on bitline 39 and $\overline{bitline}$ 43 to nodes 34 and 36, respectively.

When word line 42 is driven to a high logic state, data may be written to nodes 34 and 36 by driving voltages on bitline 38 and $\overline{bitline}$ 40, and data may be read from nodes 34 and 36 by sensing the voltages passed to bitline 38 and $\overline{bitline}$ 40.

Likewise, when word line 41 is driven to a high logic state, data may be written to nodes 34 and 36 by driving voltages on bitline 39 and $\overline{bitline}$ 43, and data may be read from nodes 34 and 36 by sensing the voltages passed to bitline 39 and $\overline{bitline}$ 43.

Figure 11:
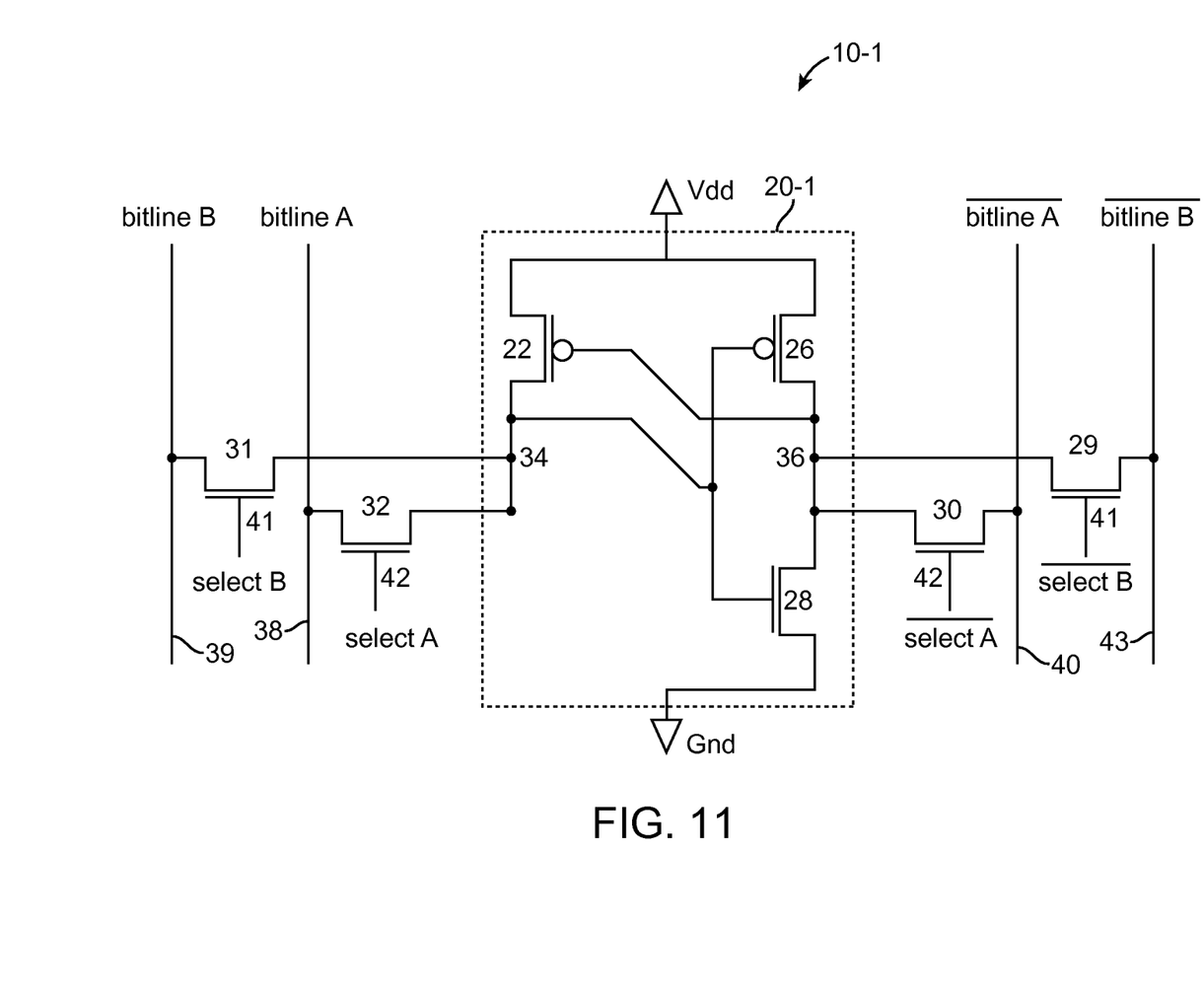
FIG. 11 shows a circuit diagram of a new dual port ROM cell of the new semiconductor memory.

FIG. 11 shows one dual port CMOS ROM memory cell 10-1 of the new semiconductor memory. The dual port ROM memory cell 10-1 has transistors connected in a second memory cell circuit 20-1, wherein the first memory cell circuit 20 has transistor 24 added to the second memory cell circuit 20-1; or the other way around, in the second memory cell circuit 20-1, transistor 24 has been omitted from the first memory cell circuit 20.

When the illustrated dual port CMOS ROM memory cell 10-1 is powered-on, leakage currents will turn transistor 28 on and transistor 22 off and the cell 10-1 remains in this state until power-off. Thus, dual port CMOS ROM memory cell 10-1 contains a logic "1".

In another dual port CMOS ROM memory cell containing a logic "1", PMOS transistor 26 has been omitted from the first memory cell circuit 20 instead of NMOS transistor 24.

Figure 12:
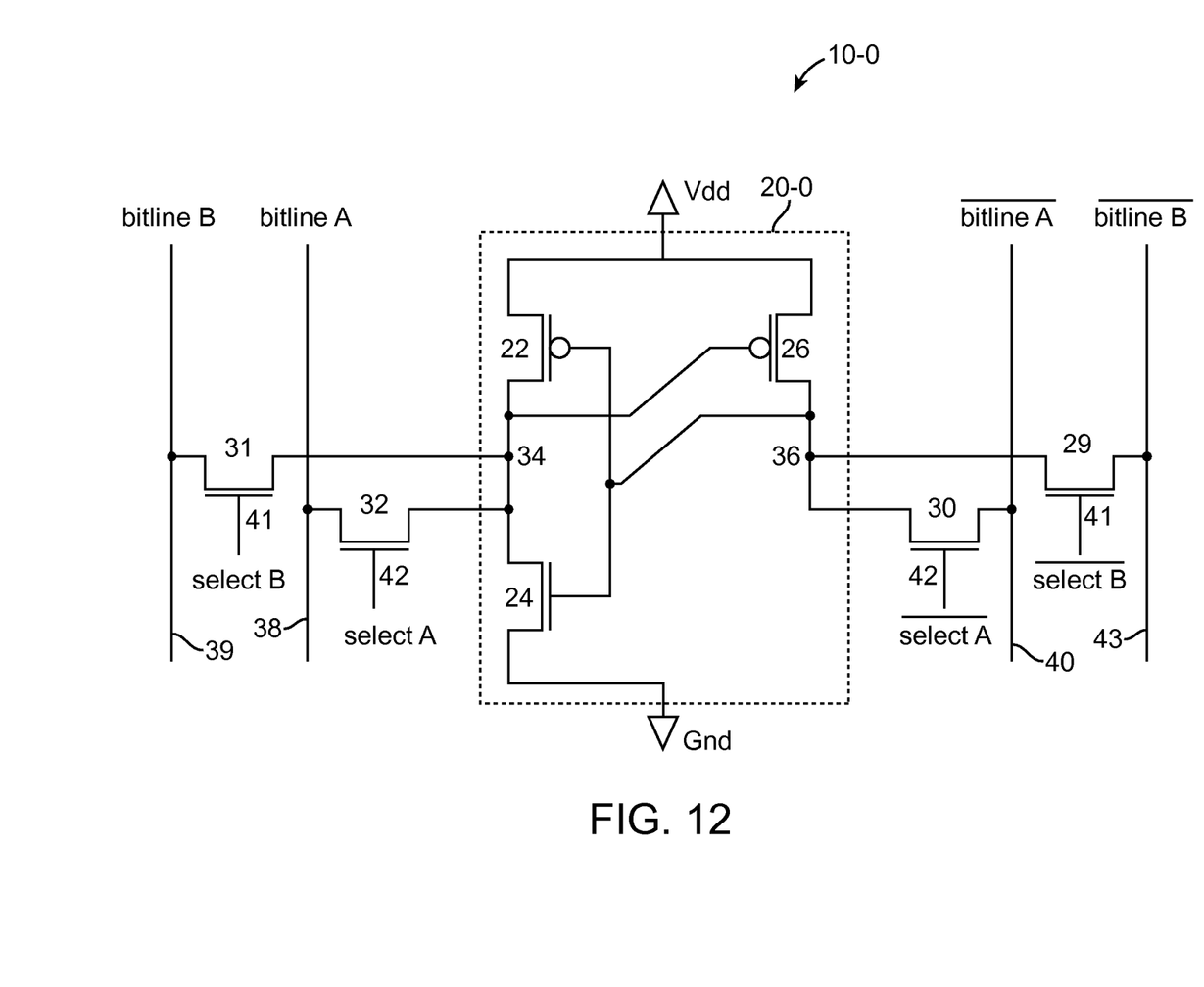
FIG. 12 shows a circuit diagram of another new dual port ROM cell of the new semiconductor memory.

FIG. 12 shows another dual port CMOS ROM memory cell 10-0 of the new semiconductor memory. The dual port ROM memory cell 10-0 has transistors connected in a second memory cell circuit 20-0, wherein the first memory cell circuit 20 has NMOS transistor 28 added to the second memory cell circuit 20-0; or the other way around, in the second memory cell circuit 20-0, transistor 28 has been omitted from the first memory cell circuit 20.

When the illustrated dual port CMOS ROM memory cell 10-0 is powered-on, leakage currents will turn transistor 24 on and transistors 22, 26 off and the cell 10-0 remains in this state until power-off. Thus, dual port CMOS ROM memory cell 10-0 contains a logic "0".

Another dual port CMOS ROM memory cell containing a logic "0", PMOS transistor 22 has been omitted from the first memory cell circuit 20 instead of NMOS transistor 28.

Further pass transistors and bitlines may be added to the memory circuits of FIGS. 8-10 for provision of a multi-port memory with more than two ports; however with the same memory cell circuits 20, 20-0, 20-1.

Figure 13:
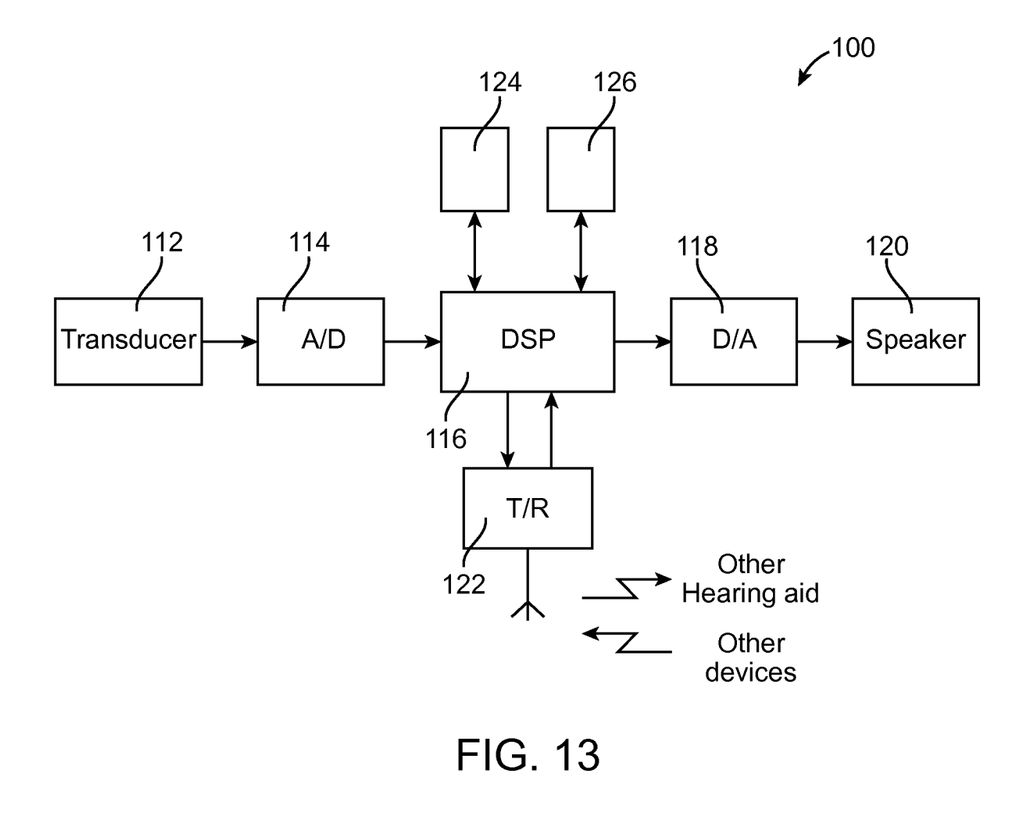
FIG. 13 shows a block diagram of a hearing aid with the new semiconductor memory.

FIG. 13 is a simplified block diagram of an exemplary new hearing aid 100 with the new semiconductor memory.

The hearing aid 100 comprises an input transducer circuit 112 that may include one or more microphones, e.g. for beamforming, and a telecoil for selection as an input to the hearing aid 100, an analogue-to-digital (N D) converter 114 for provision of a digitized electronic transducer signal in response to sound signals received at the transducer 112, a signal processor 116 (e.g. a digital signal processor or DSP) that is configured to process a selected one of, or a selected combination of, the digitized electronic transducer signal in accordance with a selected signal processing algorithm into a processed output signal for compensation of hearing loss, for example including a compressor for compensation of dynamic range hearing loss, a digital-to-analogue (D/A) converter 118, and an output transducer 120 for conversion of the processed digital output signal into an auditory output signal, e.g. a receiver outputting an acoustic signal for transmission towards the eardrum of the wearer of the hearing aid 100.

A semiconductor memory 124 is interconnected with the digital signal processor 116 of a hearing aid 100, for example as an on-chip semiconductor memory 24 of the digital signal processor 116, or on a chip external to the digital signal processor 116. The ROM part of the new semiconductor memory 124 may contain a bootstrap loader for the digital signal processor 116 loading programmes for execution by the digital signal processor 116 from an external non-volatile memory 126 into the RAM 124 of the digital signal processor 116.

The ROM part of the new semiconductor memory 124 may also contain signal processing programmes for execution by the digital signal processor 116.

Further, the hearing aid 100 has an RF transceiver 122 for wireless communication, e.g. via a wireless network, such as for wireless interconnection of two hearing aids in a binaural hearing aid system, and wireless interconnection of hearing aids with other devices, such as a remote control for a hearing aid, a fitting instrument, a mobile phone, a headset, a door bell, an alarm system, a broadcast system, etc, etc, and a communication controller 124 that is configured to turn the RF transceiver on and off in order to save power between data communication.

In the illustrated embodiments, the various components in FIG. 13 are illustrated as communicatively coupled to the processor 116. In one or more embodiments, any of the components shown in FIG. 13, such as the new semiconductor memory 124, may be implemented as a part of the processor 116 or a processing system.

Although particular embodiments have been shown and described, it will be understood that they are not intended to limit the claimed inventions, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

The invention claimed is:

1. A semiconductor memory, comprising:
   an array of volatile memory cells, wherein one of the volatile memory cells has transistors connected in a first memory cell circuit; and
   at least one non-volatile memory cell having transistors connected in a second memory cell circuit, wherein the transistors in the first memory cell circuit are at least one more than the transistors in the second memory cell circuit;
   wherein a difference between a number of the transistors in the first memory cell and a number of transistors in the second memory cell is due to the second memory cell circuit having at least one incomplete transistor structure with a missing source or a missing drain.

2. The semiconductor memory according to claim 1, wherein the first memory cell circuit is a static first memory cell circuit.

3. The semiconductor memory according to claim 1, the transistors in the first memory cell circuit are connected as two cross-coupled inverters.

4. The semiconductor memory according to claim 3, wherein the two cross-coupled inverters comprise field effect transistors.

5. The semiconductor memory according to claim 3, wherein the two cross-coupled inverters comprise bipolar transistors.

6. The semiconductor memory according to claim 1, wherein the volatile memory cells comprise CMOS volatile memory cells.

7. The semiconductor memory according to claim 1, wherein the at least one non-volatile memory cell comprises at least one CMOS non-volatile memory cell.

8. The semiconductor memory according to claim 1, wherein the semiconductor memory is a multi-port memory.

9. The semiconductor memory according to claim 1, wherein the at least one non-volatile memory cell comprises a mask-programmable non-volatile memory cell.

10. The semiconductor memory according to claim 9, wherein the second memory cell circuit is obtained by provision of a diffusion mask.

11. The semiconductor memory according to claim 1, wherein the first memory cell circuit and the second memory cell circuit have substantially the same configuration.

12. A hearing aid, comprising the semiconductor memory of claim 1, and a digital signal processor.

13. The hearing aid according to claim 12, wherein the at least one non-volatile memory cell comprises a bootstrap loader.

14. The hearing aid according to claim 12, wherein the at least one non-volatile memory cell contains a program for hearing loss compensation.

\* \* \* \* \*